(12) United States Patent
Wu

(10) Patent No.: US 11,296,209 B2
(45) Date of Patent: Apr. 5, 2022

(54) RF SWITCH DEVICE WITH A SIDEWALL SPACER HAVING A LOW DIELECTRIC CONSTANT

(71) Applicant: Taiwan Semiconductor Manufacturing Co., Ltd., Hsin-Chu (TW)

(72) Inventor: Cheng-Ta Wu, Shueishang Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/815,131

(22) Filed: Mar. 11, 2020

(65) Prior Publication Data

US 2021/0066472 A1 Mar. 4, 2021

Related U.S. Application Data

(60) Provisional application No. 62/892,115, filed on Aug. 27, 2019.

(51) Int. Cl.
*H01L 29/66* (2006.01)
*H01L 21/84* (2006.01)
(Continued)

(52) U.S. Cl.
CPC ...... *H01L 29/6653* (2013.01); *H01L 21/0228* (2013.01); *H01L 21/02164* (2013.01);
(Continued)

(58) Field of Classification Search
None
See application file for complete search history.

(56) References Cited

U.S. PATENT DOCUMENTS

2004/0173812 A1 9/2004 Currie et al.
2005/0205859 A1 9/2005 Currie et al.
(Continued)

FOREIGN PATENT DOCUMENTS

KR 20090113523 A 11/2009

OTHER PUBLICATIONS

Knotter et al., "Etching Mechanism of SiN in HF-Based Solutions", Journal of Electrochemical Society, 148 (3), F43-F46 (2001). (Year: 2001).*

*Primary Examiner* — Asok K Sarkar
(74) *Attorney, Agent, or Firm* — Eschweiler & Potashnik, LLC

(57) ABSTRACT

Various embodiments of the present disclosure are directed towards a method for forming an integrated circuit (IC). The method includes forming a gate electrode and a gate dielectric stacked over a substrate. A sidewall spacer layer is deposited over the substrate and the gate electrode, in which the sidewall spacer layer lines sidewalls of the gate electrode. An etching back is performed on the sidewall spacer layer to form a sidewall spacer on the sidewalls of the gate electrode. The etching back is performed at an etch rate less than about 8 angstroms/minute using an etchant comprising hydrogen fluoride. Further, the substrate is doped with the sidewall spacer and the gate electrode in place to form a pair of source/drain regions respectively on opposite sides of the gate electrode.

20 Claims, 9 Drawing Sheets

(51) Int. Cl.
    *H01L 27/12*     (2006.01)
    *H01L 21/02*     (2006.01)
    *H01L 21/311*    (2006.01)

(52) U.S. Cl.
    CPC ........ *H01L 21/31111* (2013.01); *H01L 21/84* (2013.01); *H01L 27/1203* (2013.01)

(56) References Cited

U.S. PATENT DOCUMENTS

| | | |
|---|---|---|
| 2008/0185617 A1 | 8/2008 | Kuan et al. |
| 2012/0003806 A1 | 1/2012 | Wang |
| 2017/0141107 A1 | 5/2017 | Kim et al. |
| 2018/0166576 A1 | 6/2018 | Wang |
| 2019/0027357 A1* | 1/2019 | Girard ................... C23C 16/345 |
| 2019/0103265 A1* | 4/2019 | Kao ................... H01L 21/0228 |
| 2019/0131400 A1 | 5/2019 | Wu et al. |
| 2020/0395211 A1* | 12/2020 | Jia ........................ C23C 16/401 |

\* cited by examiner

RF SWITCH DEVICE WITH A SIDEWALL SPACER HAVING A LOW DIELECTRIC CONSTANT

REFERENCE TO RELATED APPLICATION

This Application claims the benefit of U.S. Provisional Application No. 62/892,115, filed on Aug. 27, 2019, the contents of which are hereby incorporated by reference in their entirety.

BACKGROUND

Modern day integrated circuits (ICs) comprise millions or billions of semiconductor devices formed on a semiconductor substrate (e.g., silicon). ICs may use many different types of transistor devices, depending on application. In recent years, the increasing market for cellular and radio frequency (RF) devices has resulted in a significant increase in the demand for RF switch devices. A smartphone may, for example, incorporate 10 or more RF switch devices in its receive chain to switch a received signal to appropriate bands.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
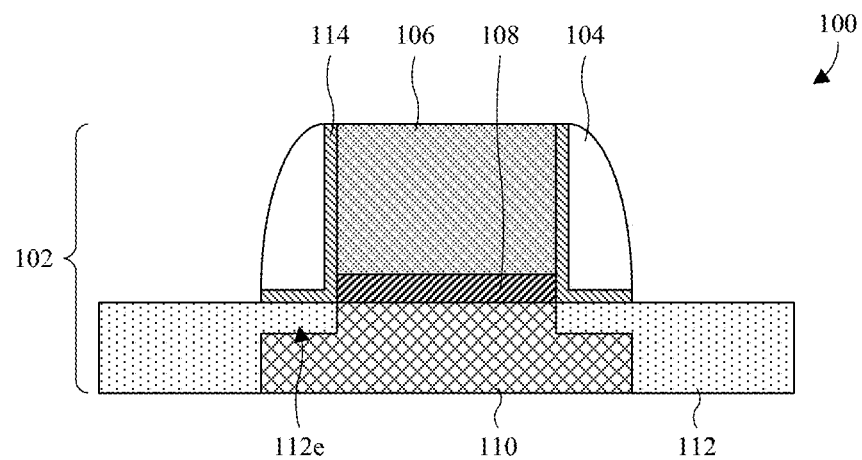
FIG. 1 illustrates a cross-sectional view of some embodiments of a radio frequency (RF) switch device with a sidewall spacer having a low dielectric constant.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a radio frequency (RF) switch device comprises a drain region, a source region, a gate electrode laterally between the drain and source regions, and a sidewall spacer comprising, for example, silicon nitride on sidewalls of the gate electrode. However, silicon nitride has a high dielectric constant, such as, for example, a dielectric constant between about 7-11. The high dielectric constant results in a large parasitic capacitance from the gate electrode to the drain region. The large parasitic capacitance provides a leakage path from the gate electrode to the drain region and also leads to insertion losses. Hence, the large parasitic capacitance degrades overall switch performance and degrades electrical isolation.

In some embodiments, to form the RF switch device, a gate electrode is formed on a substrate. A spacer layer comprising, for example, silicon nitride is deposited over the substrate and the gate electrode, and an etch back is performed into the spacer layer, thereby resulting in the sidewall spacer. Further, in some embodiments, the etch back is performed by a solution comprising 1% hydrogen fluoride by weight. However, such a solution has a high etch rate for the silicon nitride of the spacer layer, such that it is difficult to control the etch back. This, in turn, may result in over etching and/or damage to a substrate upon which the RF switch device is on. Damage to the substrate may, in turn, lead to leakage, thereby further degrading the overall switch performance of the RF switch device.

Various embodiments of the present application are directed towards an RF switch device comprising a sidewall spacer with a low dielectric constant relative to silicon nitride, as well as a method for forming the RF switch device. It has been appreciated by employing a low dielectric constant for the sidewall spacer, parasitic capacitance from the gate electrode to the drain region is low. As a result, leakage is low at this parasitic capacitance and isolation is high, whereby performance of the RF switch device is high. In some embodiments, the sidewall spacer is or comprises a dielectric material such as silicon oxycarbonitride (SiOCN), silicon oxycarbide (SiOC), or some other suitable material. It has been further appreciated that a solution comprising 1% hydrogen fluoride by weight has a low etch rate for the dielectric material (e.g., SiOCN) relative to silicon nitride. As such, the etch back to form the RF switch device may be better controlled. This, in turn, may reduce over etching and/or damage to a substrate upon which the RF switch device is on and may hence reduce leakage, thereby further increasing the overall switch performance of the RF switch device.

FIG. 1 illustrates a cross-sectional view 100 of some embodiments of an RF switch device 102 that comprises a sidewall spacer 104 with a low dielectric constant.

In some embodiments, the RF switch device 102 includes a gate electrode 106, a gate dielectric layer 108, the sidewall spacer 104, and a pair of source/drain regions 112. The gate dielectric layer 108 underlies the gate electrode 106 and spaces the gate electrode 106 from a semiconductor layer 110 upon which the RF switch device 102 is arranged. The semiconductor layer 110 may, for example, be or comprise silicon or some other suitable semiconductor material. The sidewall spacer 104 is disposed along sidewalls of the gate electrode 106 and sidewalls of the gate dielectric layer 108. The sidewall spacer 104 further overlies a pair of source/drain extensions 112e. The source/drain extensions 112e are part of the pair of source/drain regions 112 respectively on opposite sides of the gate electrode 106. The source/drain regions 112, and hence the source/drain extensions 112e, are doped regions of the semiconductor layer 110 having an opposite doping type as an adjoining portion of the semiconductor layer 110. In some embodiments, the source/drain extensions 112e have a lower doping concentration than a remainder of the source/drain regions 112.

In some embodiments, the sidewall spacer 104 comprises a sidewall spacer dielectric material with a low dielectric constant relative to silicon nitride. In further embodiments, the sidewall spacer dielectric material may, for example, be or comprise silicon oxycarbonitride (SiOCN), silicon oxycarbide (SiOC), or some other suitable material. In yet further embodiments, the low dielectric constant is between about 4.2-5.5, about 4.2-4.5, about 4.5-5.0, about 5.0-5.5, or some other suitable value. In some embodiments, the low dielectric constant of the sidewall spacer 104 is less than about 6, less than about 7, or some other suitable value. In some embodiments, the sidewall spacer 104 comprises or consists essentially of silicon, carbon, nitrogen, and oxygen, where silicon is about 30-35 atomic percent of the sidewall spacer 104, carbon is about 3-10 atomic percent of the sidewall spacer 104, nitrogen is about 16-20 atomic percent of the sidewall spacer 104, and oxygen is about 40-45 atomic percent of the sidewall spacer 104. Other atomic percentages and/or other materials are, however, amenable. In some embodiments, the gate dielectric layer 108 has a higher dielectric constant than the sidewall spacer 104.

Further, a sidewall liner 114 lines the sidewall spacer 104 and separates the sidewall spacer 104 from the gate electrode 106, the gate dielectric layer 108, and the source/drain extensions 112e. The sidewall liner 114 may, for example, be or comprise silicon dioxide or some other suitable material and/or may, for example, have a lower dielectric constant than the sidewall spacer 104 and/or the gate dielectric layer 108.

By employing a relatively low dielectric constant (e.g., the dielectric constant is less than or equal to 5.5) for the sidewall spacer 104, parasitic capacitance from the gate electrode 106 to a drain region of the pair of source/drain regions 112 is low. This is because as the dielectric constant decreases, the capacitance between the gate electrode 106 and the drain region of the pair of source/drain regions 112 decreases. As a result, leakage is low at this parasitic capacitance and isolation is high, whereby performance of the RF switch device 102 is high. In addition, reducing the parasitic capacitance from the gate electrode 106 to the drain region of the pair of source/drain regions 112 also reduces insertion loss of the RF switch device 102. In further embodiments, if, for example, the dielectric constant of the sidewall spacer 104 is less than about 4.2, then an etching rate of the sidewall spacer 104 may be increased (e.g., by a wet etch process). This may result in over etching the sidewall spacer 104 during fabrication, thereby decreasing isolation between the RF switch device 102 and other semiconductor devices (not shown) disposed within/over the semiconductor layer 110.

In some embodiments, if, for example, the atomic percentage of carbon in the sidewall spacer 104 is less than about 3, then the dielectric constant of the sidewall spacer 104 is increased. This may increase a parasitic capacitance between the drain region of the pair of source/drain regions 112 and the gate electrode 106 of the RF switch device 102. In further embodiments, if, for example, the atomic percentage of nitrogen in the sidewall spacer 104 is greater than about 20, then the dielectric constant of the sidewall spacer 104 may be increased. This may further increase a parasitic capacitance between the drain region of the pair of source/drain regions 112 and the gate electrode 106 of the RF switch device 102. In yet further embodiments, if, for example, the atomic percentage of oxygen in the sidewall spacer 104 is less than about 40, then the dielectric constant of the sidewall spacer 104 is increased. This may even further increase a parasitic capacitance between the drain region of the pair of source/drain regions 112 and the gate electrode 106 of the RF switch device 102. In alternative embodiments, if, for example, the atomic percentage of oxygen in the sidewall spacer 104 is greater than about 45, then a rate in which the sidewall spacer 104 (e.g., the sidewall spacer layer 904 of FIG. 9) is etched (e.g., by a wet etch) by a solution comprising about 1% hydrogen fluoride by weight is increased. This may result in over etching the sidewall spacer 104 (e.g., the sidewall spacer layer 904 of FIG. 9) during the etching process, thereby decreasing isolation between the RF switch device 102 and other semiconductor devices (not shown) disposed within/over the semiconductor layer 110.

Figure 2:
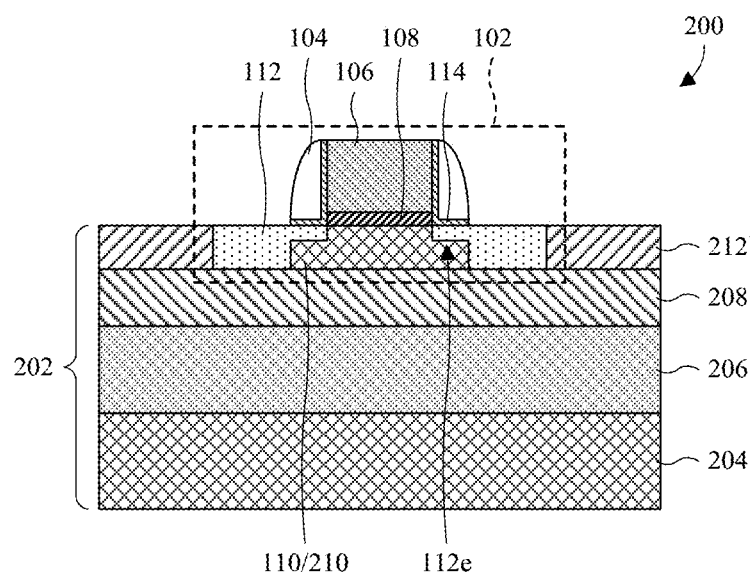
FIG. 2 illustrates a cross-sectional view of some embodiments of an integrated circuit (IC) in which the RF switch device of FIG. 1 is on a full depletion (FD) semiconductor-on-insulator (SOI) substrate for RF.
Figure 3A:
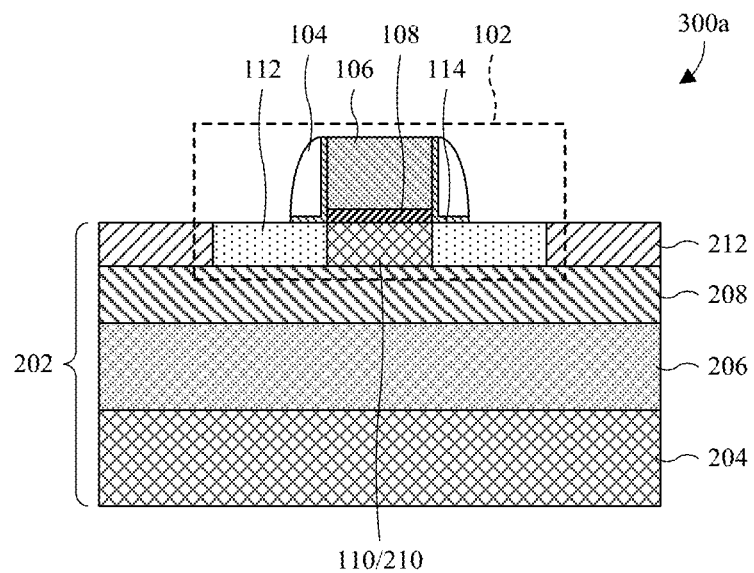
FIGS. 3A-3E illustrate cross-sectional views of some alternative embodiments of the IC of FIG. 2.
Figure 3B:
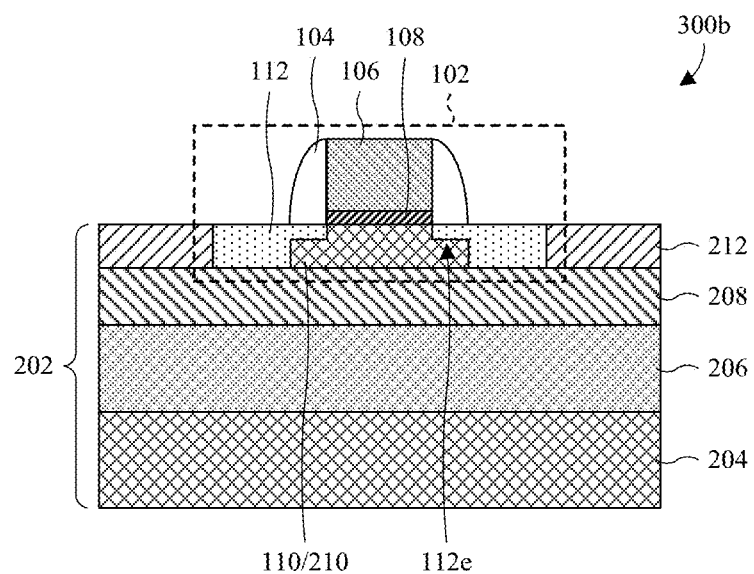
Figure 3C:
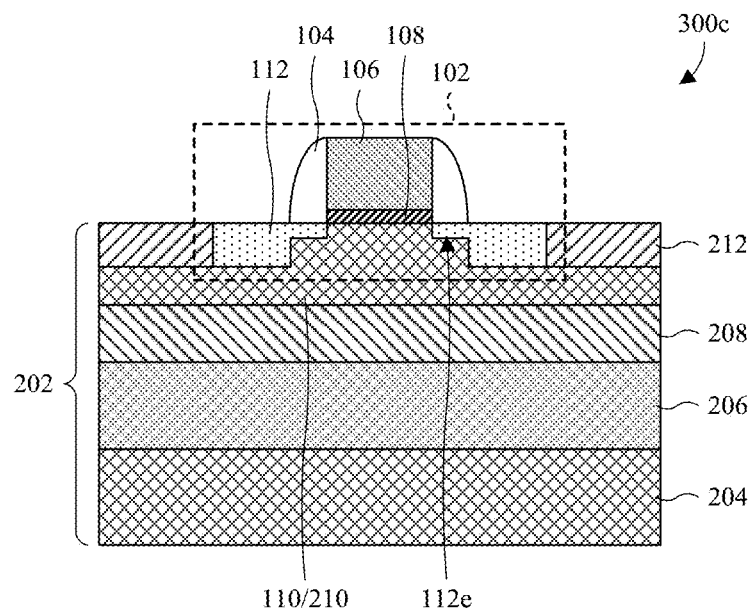
Figure 3D:
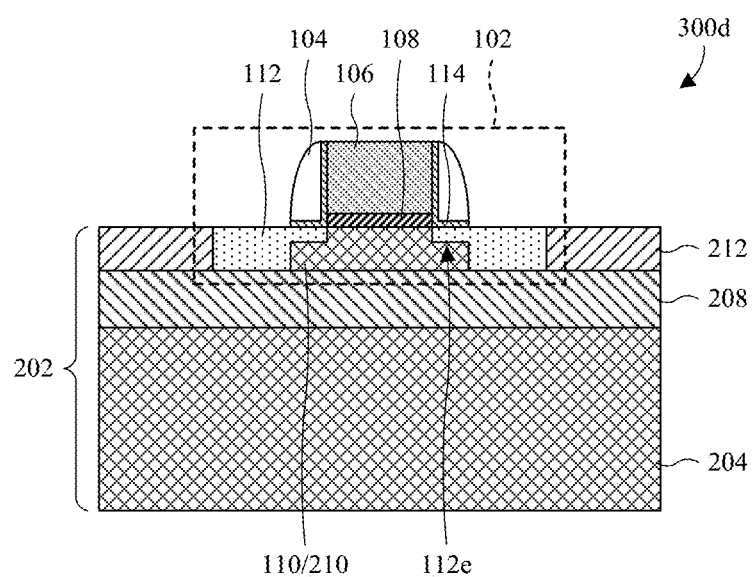
Figure 3E:
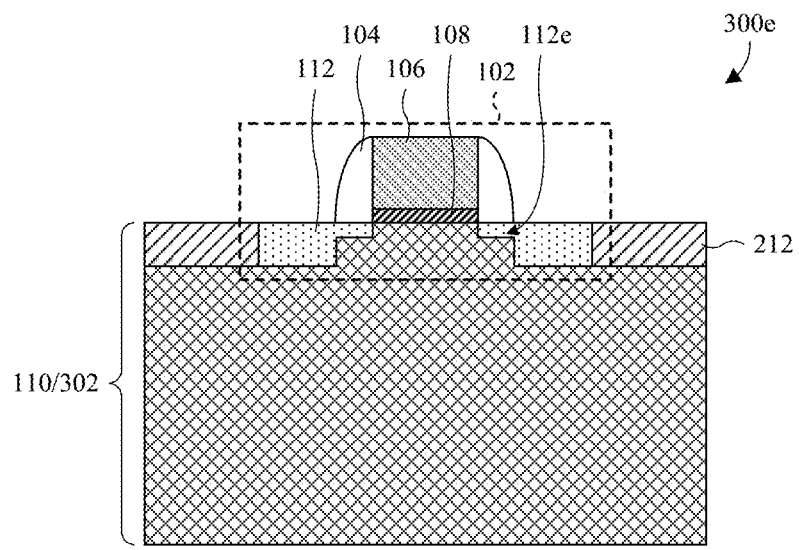

FIG. 2 illustrates a cross-sectional view 200 of some embodiments of an integrated circuit (IC) in which the RF switch device 102 of FIG. 1 is on a semiconductor-on-insulator (SOI) substrate 202.

The SOI substrate 202 comprises a high resistivity layer 204, a trap-rich layer 206 overlying the high resistivity layer 204, an insulator layer 208 overlying the trap-rich layer 206, and a device layer 210 overlying the insulator layer 208. The high resistivity layer 204 has a high resistance to reduce RF losses from the RF switch device 102, thereby increasing a performance of the RF switch device 102. The high resistance may, for example, be between about 1,000-10,000 ohms, about 1,000-5,000 ohms, about 5,000-10,000 ohms, or some other suitable value. The high resistivity layer 204 may, for example, be or comprise silicon or some other suitable semiconductor material.

The trap-rich layer 206 comprises a high concentration of electron traps to reduce the parasitic surface conduction (PSC) effect along a top surface of the high resistivity layer 204. The PSC effect may, for example, be caused by fixed charge in the insulator layer 208. The trap-rich layer 206 may, for example, be or comprise polysilicon or some other suitable material. Further, the trap-rich layer 206 may, for example, have a thickness of about 1.0-2.0 micrometers, about 1.0-1.5 micrometers, about 1.5-2.0 micrometers, or some other suitable value.

The insulator layer 208 provides electrical isolation between the trap-rich layer 206 and the device layer 210. In some embodiments, the insulator layer 208 has a lower dielectric constant than the sidewall spacer 104. In other embodiments, the insulator layer 208 has a higher dielectric constant than the sidewall spacer 104. The insulator layer 208 may, for example, be or comprise silicon dioxide and/or some other suitable dielectric material. The insulator layer 208 may, for example, have a thickness of about 1,000-4,000 angstroms, about 1,000-2,500 angstroms, about 2,500-4,000 angstroms, or some other suitable value.

The device layer 210 is a semiconductor layer within which the RF switch device 102 is formed. The device layer 210 corresponds to the semiconductor layer 110 of FIG. 1. Further, the device layer 210 is sufficiently thin to promote full depletion of the RF switch device 102. That is to say, a depletion region of the RF switch device 102 extends through a full thickness of the device layer 210. The depletion region may, for example, form in the device layer 210 due to the gate electrode 106 being polysilicon having an opposite doping type as a portion of the device layer 210 directly under the gate electrode 106. The device layer 210 may, for example, have a thickness of about 50-100 nanometers, about 50-75 nanometers, about 75-100 nanometers, or some other suitable value. The device layer 210 may, for example, be or comprise silicon or some other suitable semiconductor material. In some embodiments, the device layer 210 and the high resistivity layer 204 are or comprise a same semiconductor material.

An isolation structure 212 extends into the device layer 210 to the insulator layer 208. Further, the isolation structure surrounds the RF switch device 102. The isolation structure 212 provides electrical isolation between the RF switch device 102 and other devices (not shown) on the SOI substrate 202. The isolation structure 212 is or comprises silicon dioxide and/or some other suitable dielectric material. The isolation structure 212 may, for example, be a shallow trench isolation (STI) structure, a deep trench isolation (DTI) structure, and/or some other suitable isolation structure.

FIGS. 3A-3E illustrate cross-sectional views 300a-300e of some alternative embodiments of the IC of FIG. 2. As illustrated by the cross-sectional view 300a of FIG. 3A, the source/drain extensions 112e are omitted. As illustrated by the cross-sectional view 300b of FIG. 3B, the sidewall liner 114 is omitted. As illustrated by the cross-sectional view 300c of FIG. 3C, the device layer 210 is thicker so the depletion region of the RF switch device 102 extends partially, not fully, through a thickness of the device layer 210. As illustrated by the cross-sectional view 300d of FIG. 3D, the trap-rich layer 206 is omitted. As illustrated by the cross-sectional view 300e of FIG. 3E, a bulk semiconductor substrate 302 is used in place of the SOI substrate 202 and corresponds to the semiconductor layer 110 of FIG. 1.

While FIGS. 3A-3E each illustrate a different variation to the IC of FIG. 2, FIG. 2 may be modified with any combination of the variations in FIGS. 3A-3E. For example, the source/drain extensions 112e may be omitted (as in FIG. 3A) and the trap-rich layer 206 may be omitted (as in FIG. 3D).

Figure 4:
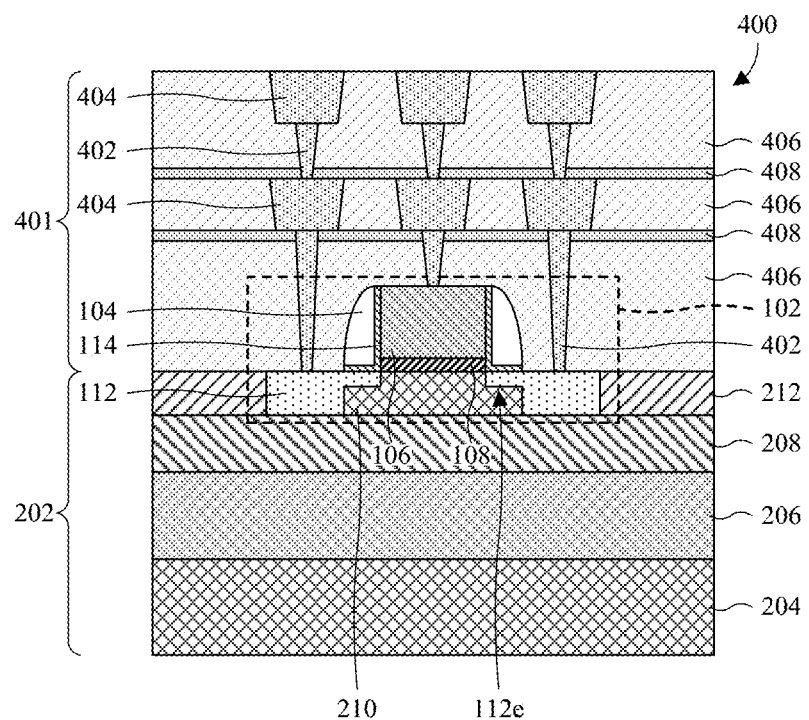
FIG. 4 illustrates a cross-sectional view of some embodiments of an interconnect structure overlying an RF switch device with a sidewall spacer having a lower dielectric constant.

FIG. 4 illustrates a cross-sectional view 400 of some embodiments of an IC having an interconnect structure 401 overlying an RF switch device 102 with a sidewall spacer 104 having a low dielectric constant.

In some embodiments, the IC includes the RF switch device 102 disposed within/over the SOI substrate 202. In further embodiments, the SOI substrate 202 comprises the high resistivity layer 204, the trap-rich layer 206 overlying the high resistivity layer 204, the insulator layer 208 overlying the trap-rich layer 206, and the device layer 210 overlying the insulator layer 208. The SOI substrate 202 of FIG. 4 may, for example, be illustrated and/or described as the SOI substrate 202 of FIG. 2. Further, the RF switch device 102 is disposed over and/or on the device layer 210 of the SOI substrate 202 and/or may be configured as the RF switch device 102 of FIGS. 1 through 3E.

In some embodiments, the device layer 210 may comprise a first doping type (e.g., p-type) with a first doping concentration and the pair of source/drain regions 112 of the RF switch device 102 may comprise a second doping type (e.g., n-type) opposite the first doping type with a second doping concentration. In some embodiments, the first doping type may be p-type and the second doping type may be n-type, or vice versa. In further embodiments, the first doping concentration of the device layer 210 is less than the second doping concentration of the pair of source/drain regions 112. In some embodiments, the gate electrode 106 may, for example, be or comprise polysilicon, doped polysilicon, or a metal, such as tungsten, titanium nitride, tantalum nitride, titanium, tantalum, a silicide, another conductive material, or any combination of the foregoing. In some embodiments, the gate dielectric layer 108 may, for example, be or comprise an oxide, such as silicon dioxide, a high-k dielectric material, such as silicon oxynitride, hafnium oxide, hafnium oxynitride, hafnium aluminum oxide, zirconium oxide, another suitable dielectric material, or any combination of the foregoing. As used herein, a high-k dielectric material is a dielectric material with a dielectric constant greater than 3.9.

The interconnect structure 401 overlies the SOI substrate 202. The interconnect structure 401 comprises a plurality of conductive vias 402, a plurality of conductive wires 404, and an interconnect dielectric structure. The plurality of conductive vias and wires 402, 404 are disposed within the interconnect dielectric structure and are configured to electrically couple devices disposed within and/or over the SOI substrate 202 to one another and/or to another IC (not shown). The interconnect dielectric structure comprises a plurality of inter-level dielectric (ILD) layers 406 and a plurality of dielectric protection layers 408. A bottommost layer of conductive vias 402 extend from a bottommost layer of the conductive wires 404 to the pair of source/drain regions 112 and the gate electrode 106 of the RF switch device 102. The conductive vias 402 extend through the dielectric protections layers 408 (which can be made of dielectric material and/or act as etch stop layers during manufacturing of the IC). In some embodiments, the conductive vias and/or wires 402, 404 may, for example, respectively be or comprise aluminum, copper, tungsten, titanium nitride, tantalum nitride, another suitable conductive material, or any combination of the foregoing. In some embodiments, the ILD layers 406 may, for example, be or comprise an oxide, such as silicon dioxide, a low-k dielectric material, an extreme low-k dielectric material, another dielectric material, or any combination of the foregoing. As used herein, a low-k dielectric material is a dielectric material with a dielectric constant less than 3.9. Thus, in some embodiments, the sidewall spacer 104 has a dielectric constant greater than the ILD layers 406. In further embodiments, the dielectric protection layers 408 may, for example, be or comprise silicon nitride, silicon carbide, silicon oxynitride, another suitable dielectric material, or the like. Therefore, in some embodiments, the sidewall spacer 104 has a dielectric constant less than the dielectric protections layers 408.

FIGS. 5-12 illustrate cross-sectional views 500-1200 of some embodiments of a method for forming an RF switch device with a sidewall spacer having a low dielectric constant according to the present disclosure. Although the cross-sectional views 500-1200 shown in FIGS. 5-12 are described with reference to a method, it will be appreciated that the structures shown in FIGS. 5-12 are not limited to the method but rather may stand alone separate of the method. Further, although FIGS. 5-12 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
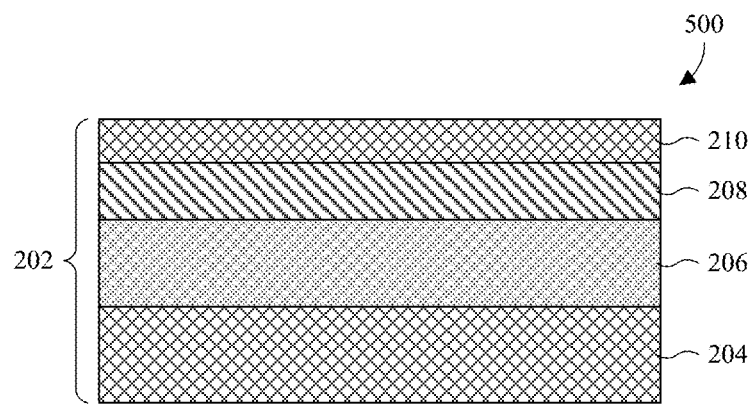
FIGS. 5-12 illustrate a series of cross-sectional views of some embodiments of a method for forming an RF switch device with a sidewall spacer having a low dielectric constant.

As illustrated by the cross-sectional view 500 of FIG. 5, an SOI substrate 202 is provided. In some embodiments, the SOI substrate 202 comprises a high resistivity layer 204, a trap-rich layer 206 overlying the high resistivity layer 204, an insulator layer 208 overlying the trap-rich layer 206, and a device layer 210 overlying the insulator layer 208. In such embodiments, the SOI substrate 202 may be illustrated and/or described as the SOI substrate 202 of FIG. 2. In alternative embodiments, the SOI substrate 202 is replaced with a bulk semiconductor substrate, an example of which is in FIG. 3E. In alternative embodiments, the trap-rich layer 206 is omitted, an example of which is in FIG. 3D.

Figure 6:
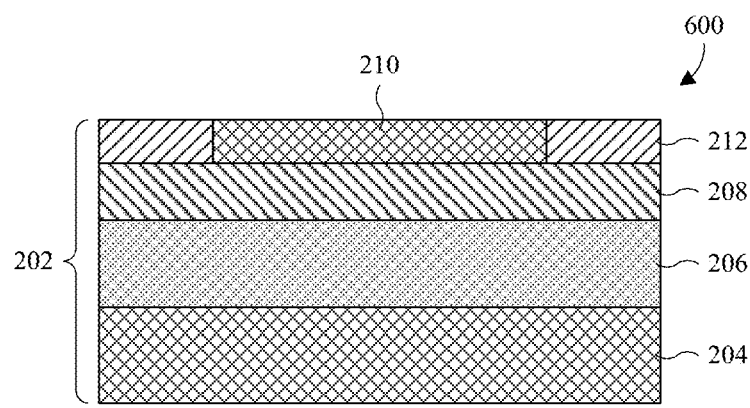

As illustrated by the cross-sectional view 600 of FIG. 6, an isolation structure 212 is formed extending into atop surface of the device layer 210 to the insulator layer 208. The isolation structure 212 surrounds and demarcates a device region. For example, the isolation structure 212 may extend laterally in a closed path along a border of the device region when viewed top down. In some embodiments, a process for forming the isolation structure 212 includes: depositing (e.g., by a chemical vapor deposition (CVD) process, a physical vapor deposition (PVD) process, an atomic layer deposition (ALD) process, etc.) a pad oxide layer covering the SOI substrate 202; depositing (e.g., by a CVD process, a PVD process, an ALD process, etc.) a pad nitride layer covering the pad oxide layer; patterning the pad oxide and nitride layers to form a trench with a layout of the isolation structure 212; performing an etch (e.g., a wet etch and/or a dry etch) into the SOI substrate 202 with the pad oxide and nitride layers in place to extend the trench into the SOI substrate 202; depositing (e.g., by a CVD process, a PVD process, an ALD process, thermal oxidation, etc.) a dielectric layer filling the trench and covering the device layer 210; performing a planarization process (e.g., a chemical mechanical planarization (CMP) process) into a top of the dielectric layer; and removing the pad oxide and/or nitride layers. Other processes are, however, amenable for forming the isolation structure 212.

Figure 7:
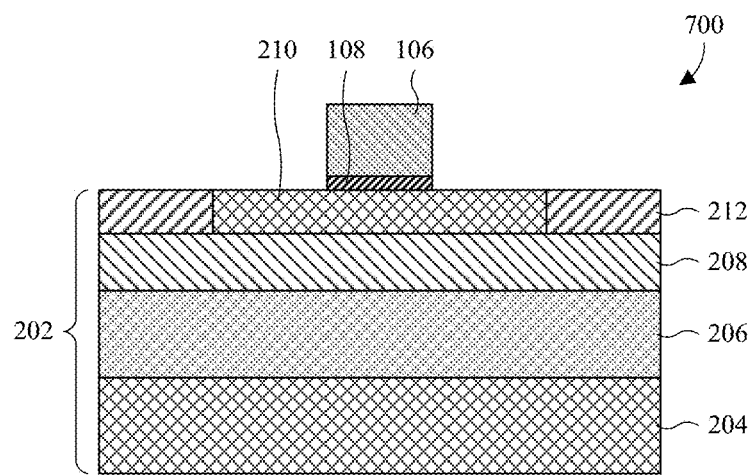

As illustrated by the cross-sectional view 700 of FIG. 7, a gate electrode 106 and a gate dielectric layer 108 are formed stacked on the device region. As noted above, the device region is a region of the device layer 210 surrounded and demarcated by the isolation structure 212. In some embodiments, a process for forming the gate electrode 106 and the gate dielectric layer 108 includes: depositing (e.g., by a CVD process, a PVD process, an ALD process, thermal oxidation, etc.) a dielectric layer covering the device layer 210; depositing (e.g., by a CVD process, a PVD process, an ALD process, sputtering, electroless plating, electroplating, etc.) a conductive layer covering the dielectric layer; and patterning the dielectric layer and the conductive layer respectively, thereby defining the gate dielectric layer 108 and the gate electrode 106. Other processes are, however, amenable. For example, the gate electrode 106 and/or the gate dielectric layer 108 may be formed by a high-k metal gate (HKMG) replacement process. In such embodiments, the sidewall spacer 104 of FIG. 10 may be formed before depositing the gate electrode 106.

Figure 8:
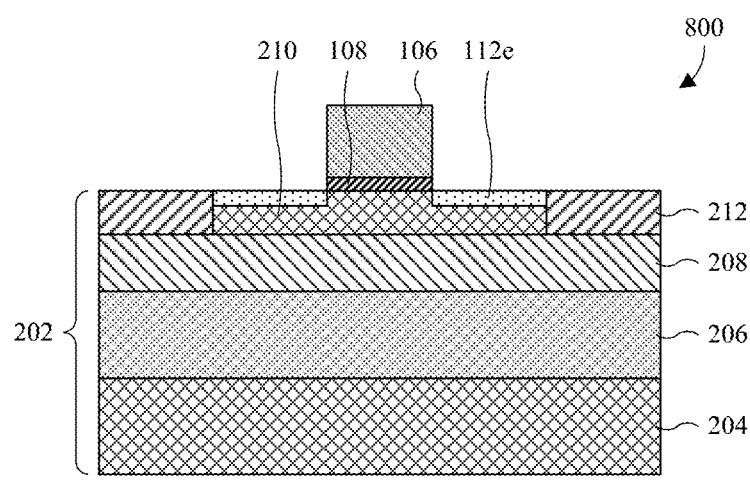

As illustrated by the cross-sectional view 800 of FIG. 8, a top portion of the device layer 210 is lightly doped to sides of the gate electrode 106. The doping forms a pair of source/drain extensions 112e having an opposite doping type as adjoining portions of the device layer 210. In alternative embodiments, the light doping is omitted and the source/drain extensions 112e are not formed. In further embodiments, the device layer 210 may comprise a first doping type (e.g., p-type), and the pair of source/drain extensions 112e may comprise a second doping type (e.g., n-type) opposite the first doping type. In alternative embodiments, the light doping is omitted and the source/drain extensions 112e are not formed. The doping may, for example, employ the gate electrode 106 (or a hard mask (not shown) on the gate electrode 106) as a mask. The doping may, for example, be performed by ion implantation and/or some other suitable doping process.

Figure 9:
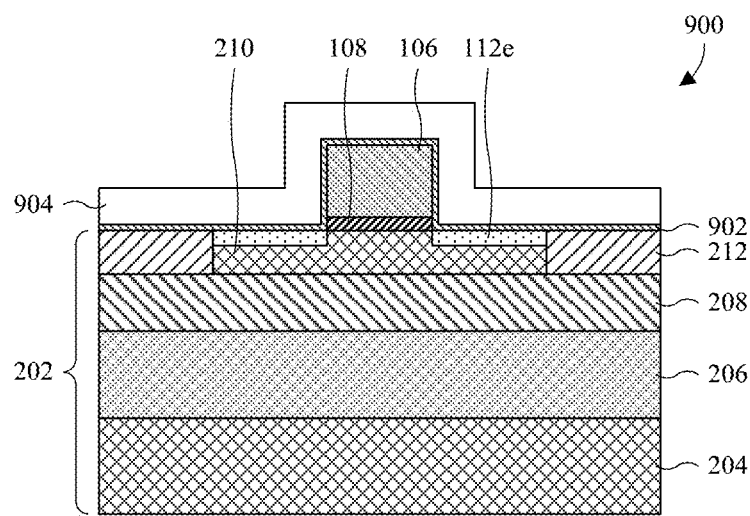

As illustrated by the cross-sectional view 900 of FIG. 9, a sidewall liner layer 902 is deposited (e.g., by a CVD process, a PVD process, an ALD process, thermal oxidation, etc.) over the device layer 210 and the gate electrode 106, and further lining sidewalls of the gate electrode 106. In alternative embodiments, the depositing of the sidewall liner layer 902 is omitted (see, for example, FIGS. 3B, 3C and 3E where the sidewall liner 114 is omitted). In some embodiments, the sidewall liner layer 902 may, for example, be or comprise silicon dioxide, another suitable dielectric material, or a combination of the foregoing.

Also illustrated by the cross-sectional view 900 of FIG. 9, a sidewall spacer layer 904 is deposited over the sidewall liner layer 902. In embodiments in which the sidewall liner layer 902 is omitted, the sidewall spacer layer 904 further occupies the space presently occupied by the sidewall liner layer 902. In some embodiments, the sidewall spacer layer 904 comprises a sidewall spacer dielectric material with a low dielectric constant relative to silicon nitride. In further embodiments, the sidewall spacer dielectric material may, for example, be or comprise silicon oxycarbonitride (SiOCN), silicon oxycarbide (SiOC), or some other suitable material. In yet further embodiments, the low dielectric constant is between about 4.2-5.5, about 4.2-4.5, about 4.5-5.0, about 5.0-5.5, or some other suitable value. In some embodiments, the low dielectric constant of the sidewall spacer layer 904 is less than about 6, less than about 7, or some other suitable value. In some embodiments, the sidewall spacer layer 904 comprises or consists essentially of silicon, carbon, nitrogen, and oxygen, where silicon is about 30-35 atomic percent of the sidewall spacer layer 904, carbon is about 3-10 atomic percent of the sidewall spacer layer 904, nitrogen is about 16-20 atomic percent of the sidewall spacer layer 904, and oxygen is about 40-45 atomic percent of the sidewall spacer layer 904. Other atomic percentages and/or other materials are, however, amenable. In some embodiments, the gate dielectric layer 108 has a higher dielectric constant than the sidewall spacer layer 904 and/or the sidewall liner layer 902 has a lower dielectric constant than the sidewall spacer layer 904. Further, the sidewall spacer layer 904 may, for example, have a dielectric constant less than that of the pad nitride layer described with regard to FIG. 6 and/or greater than that of the pad oxide layer described with regard to FIG. 6.

In some embodiments, the sidewall spacer layer 904 is deposited by ALD, low pressure chemical vapor deposition (LPCVD), or some other suitable deposition. In further embodiments, the sidewall spacer layer 904 may be formed solely by an ALD process or solely by a LPCVD process. In some embodiments in which the sidewall spacer layer 904 is deposited by a first ALD process, deposition of the sidewall spacer layer 904 comprises sequentially flowing the following gases over the device layer 210 in the following order: 1) hexachlorodisilane (e.g., $Si_2Cl_6$); 2) propene (e.g., $C_3H_6$); 3) diatomic oxygen (e.g., $O_2$); and 4) ammonia (e.g., $NH_3$), thereby forming the sidewall spacer layer 904 such that the sidewall spacer layer 904 comprises, for example, silicon oxycarbonitride (SiOCN). In some embodiments, the foregoing sequence is performed at an ambient temperature of about 580-650 degrees Celsius (° C.), about 580-615° C., about 615-650° C., or some other suitable temperature. In further embodiments, the hexachlorodisilane of step 1) above is a high-purity hexachlorodisilane (HCD). By performing the first ALD process at the ambient temperature, the sidewall spacer layer 904 comprises or consists essentially of silicon, carbon, nitrogen, and oxygen (e.g., silicon oxycarbonitride (SiOCN)), where silicon is about 30-35 atomic percent of the sidewall spacer layer 904, carbon is about 3-10 atomic percent of the sidewall spacer layer 904, nitrogen is about 16-20 atomic percent of the sidewall spacer layer 904, and oxygen is about 40-45 atomic percent of the sidewall spacer 104. This, in some embodiments, ensures that the sidewall spacer layer 904 comprises silicon oxycarbonitride (SiOCN) and/or has the low dielectric constant that is between about 4.5-5.5.

In some embodiments, if, for example, the atomic percentage of carbon in the sidewall spacer layer 904 is less than about 3, then the dielectric constant of the sidewall spacer layer 904 is increased. This may increase a parasitic capacitance between a drain region and the gate electrode 106 of the RF switch device (102 of FIG. 11). In some embodiments, if, for example, the atomic percentage of carbon in the sidewall spacer layer 904 is greater than about 10, then a rate in which the sidewall spacer layer 904 is etched (e.g., by a wet etch) during subsequent processing steps may be increased. This may, for example, result in over etching the sidewall spacer layer 904 during the subsequent processing steps, thereby decreasing isolation between the RF switch device (102 of FIG. 11) and other semiconductor devices (not shown) disposed within/over the SOI substrate 202. In some embodiments, if, for example, the atomic percentage of nitrogen in the sidewall spacer layer 904 is greater than about 20, then the dielectric constant of the sidewall spacer layer 904 may be increased. This may further increase a parasitic capacitance between a drain region and the gate electrode 106 of the RF switch device (102 of FIG. 11). In further embodiments, if, for example, the atomic percentage of oxygen in the sidewall spacer layer 904 is less than about 40, then the dielectric constant of the sidewall spacer layer 904 is increased. This may further increase a parasitic capacitance between a drain region and the gate electrode 106 of the RF switch device (102 of FIG. 11). In alternative embodiments, if, for example, the atomic percentage of oxygen in the sidewall spacer layer 904 is greater than about 45, then a rate in which the sidewall spacer layer 904 is etched (e.g., by a wet etch) during subsequent processing steps is increased. This may result in over etching the sidewall spacer layer 904 during the subsequent processing steps, thereby decreasing isolation between the RF switch device (102 of FIG. 11) and other semiconductor devices (not shown) disposed within/over the SOI substrate 202.

In alternative embodiments, the sidewall spacer layer 904 is deposited by a second ALD process that comprises sequentially flowing the following gases over the device layer 210 in the following order: 1) hexachlorodisilane (e.g., $Si_2Cl_6$); 2) propene (e.g., $C_3H_6$); and 3) diatomic oxygen (e.g., $O_2$), thereby forming the sidewall spacer layer 904 such that the sidewall spacer layer 904 comprises, for example, silicon oxycarbide (SiOC). In some embodiments, the second ALD process sequence is performed at an ambient temperature of about 580-650 degrees Celsius (° C.), about 580-615° C., about 615-650° C., or some other suitable temperature. This, in some embodiments, ensures that the sidewall spacer layer 904 comprises silicon oxycarbide (SiOC) and/or has the low dielectric constant between about 4.2-4.5. This may decrease a parasitic capacitance between a drain region and the gate electrode 106 of the RF switch device (102 of FIG. 11), thereby increasing the overall switch performance of the RF switch device (102 of FIG. 11). In yet another alternative embodiments, the sidewall spacer layer 904 may, for example, be or comprise silicon carbide (SiC) and/or another suitable dielectric material.

In further embodiments, the second ALD process may omit the propene flow at step number two and instead may include performing a polishing process to remove impurities after performing the hexachlorodisilane flow. Thus, in such embodiments, the second ALD process may include: 1) flowing hexachlorodisilane (e.g., $Si_2Cl_6$) over the device layer 210; 2) performing the polishing process; and 3) flowing diatomic oxygen (e.g., $O_2$) over the device layer 210, thereby forming the sidewall spacer layer 904. In some embodiments, the polishing process may include exposing the structure of FIG. 9 to one or more etchants, such as hydrofluoric acid, nitric acid, glacial acetic acid, another suitable etchant, or any combination of the foregoing.

Figure 10:
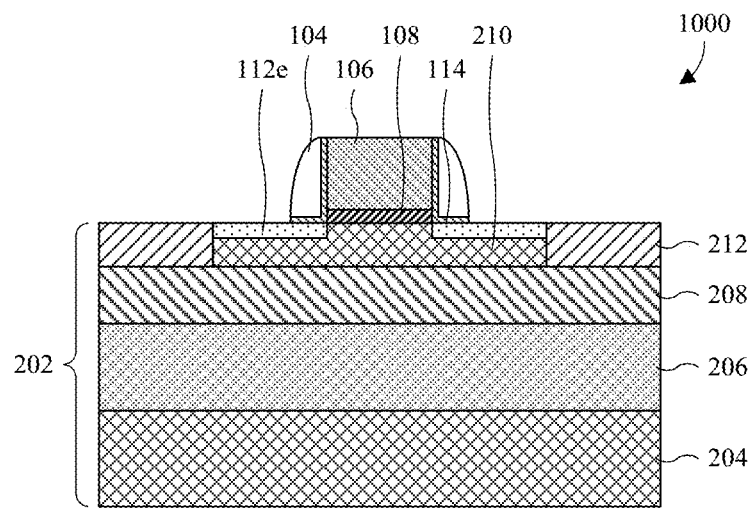

As illustrated by the cross-sectional view 1000 of FIG. 10, an etch back is performed into the sidewall liner layer (902 of FIG. 9) and the sidewall spacer layer (904 of FIG. 9). The etch back forms the sidewall spacer 104 and the sidewall liner 114 respectively from the sidewall spacer layer (904 of FIG. 9) and the sidewall liner layer (902 of FIG. 9). In some embodiments, the etch back includes performing a wet etch process with an etchant solution that comprises about 1% hydrogen fluoride by weight to the sidewall liner layer (902 of FIG. 9) and the sidewall spacer layer (904 of FIG. 9). Other percentages are, however, amenable for the hydrogen fluoride. For example, the etchant solution may be about 0.001-1.0% hydrogen fluoride by weight. In some embodiments, the etchant solution is an aqueous solution in which the solvent is deionized water or some other suitable solvent. In some embodiments, the etch back is performed at an ambient temperature of about 600-650° C., about 630° C., or some other suitable value.

In some embodiments, the sidewall spacer layer (904 of FIG. 9) is etched at a low rate relative to a high rate in which silicon nitride would be etched during the etch back. In further embodiments, silicon nitride may, for example, be etched at a high rate of about 8 angstroms per minute during the etch back, while the sidewall spacer layer (904 of FIG. 9) may, for example, be etched at a low rate of about 5 angstroms per minute during the etch back. Thus, in some embodiments, the etch back etches the sidewall spacer layer (904 of FIG. 9) a low rate less than about 8 angstroms per minute or some other suitable rate. For example, in at least embodiments in which the sidewall spacer layer (904 of FIG. 9) is or comprises silicon oxycarbonitride and the etch back is performed by an aqueous solution comprising about 1% hydrogen fluoride by weight, the etch back rate may be performed at a rate of about 5 angstroms per minute. By etching back the sidewall spacer layer (904 of FIG. 9) at a low rate, the etch back may be better controlled such that a shape and/or width of the sidewall spacer 104 may be controlled. This, in turn, may reduce over etching and/or damage to the device layer 210 and may hence reduce leakage. Further, this may increase isolation between the RF switch device (102 of FIG. 11) and other semiconductor devices (not shown) disposed within/over the SOI substrate 202. In yet further embodiments, the sidewall liner layer (902 of FIG. 9) may be etched more quickly than the sidewall spacer layer (904 of FIG. 9) during the etch back. In some embodiments, if the etchant solution is, for example, greater than about 1.0% hydrogen fluoride by weight, then the sidewall spacer layer (904 of FIG. 9) and/or the device layer 210 may be over etched during the etch back, thereby degrading a performance of the RF switch device (102 of FIG. 11).

Figure 11:
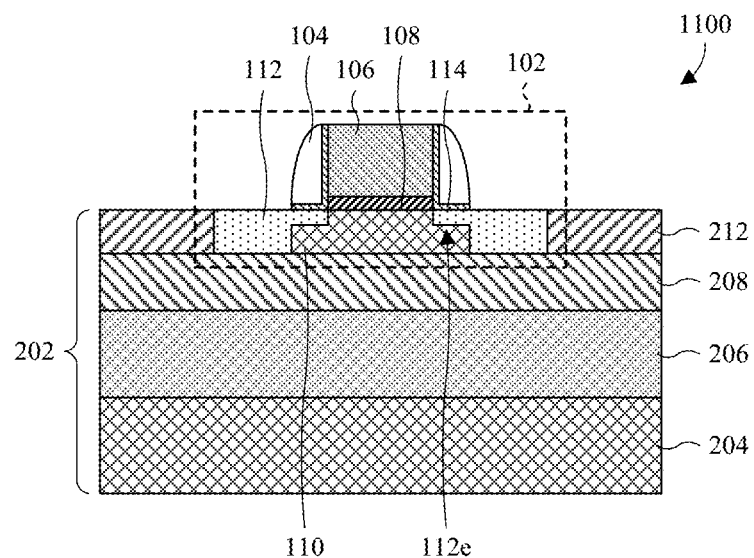

As illustrated by the cross-sectional view 1100 of FIG. 11, the device layer 210 is doped to form a pair of source/drain regions 112, thereby defining the RF switch device 102. The source/drain regions 112 overlap with the source/drain extensions 112*e* and have a same doping type, albeit a higher doping concentration, than the source/drain extensions 112*e*. In alternative embodiments, the doping at FIG. 11 to form the source/drain regions 112 is performed at FIG. 8 in place of the light doping to form the source/drain extensions 112*e*, such that the source/drain extensions are omitted. The doping may, for example, employ the sidewall spacer 104 and the gate electrode 106 (or a hard mask (not shown) on the gate electrode 106) as a mask. The doping may, for example, be performed by ion implantation and/or some other suitable doping process.

By employing a low dielectric constant for the sidewall spacer 104, parasitic capacitance from the gate electrode 106 to a drain region of the pair of source/drain regions 112 is low. As a result, leakage is low at this parasitic capacitance and isolation is high, whereby performance of the RF switch device 102 is high.

Figure 12:
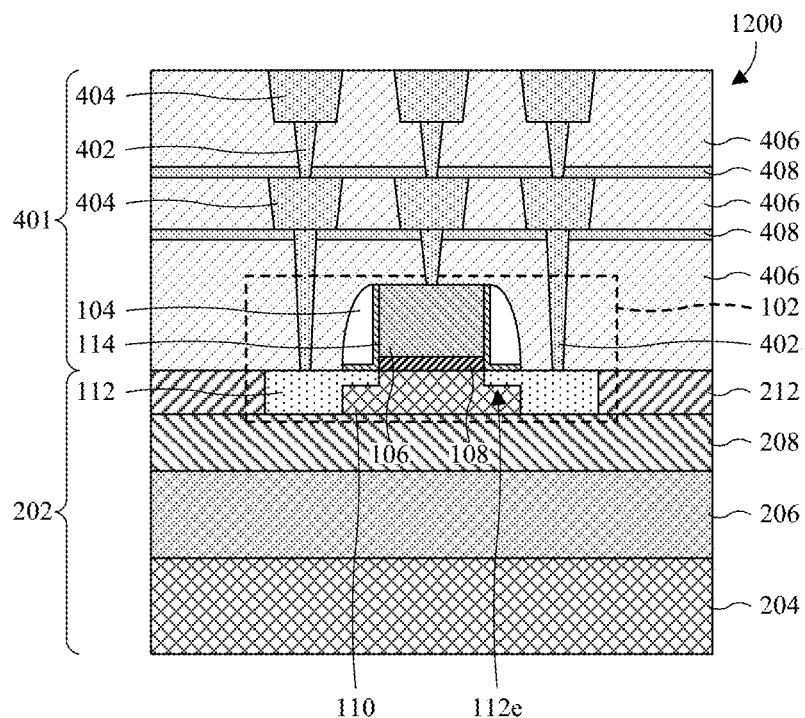

As illustrated by the cross-sectional view 1200 of FIG. 12, an interconnect structure 401 is formed over the SOI substrate 202 and the RF switch device 102. The interconnect structure 401 comprises a plurality of conductive vias 402, a plurality of conductive wires 404, a plurality of inter-level dielectric (ILD) layers 406, and a plurality of dielectric protection layers 408. In some embodiments, the conductive vias and wires 402, 404 may be formed by a single damascene process and/or a dual damascene process. In further embodiments, the ILD layers 406 and/or the dielectric protection layers 408 may, for example, respectively be deposited by a CVD process, a PVD process, an ALD process, thermal oxidation, or another suitable growth or deposition process. In yet further embodiments, the dielectric protection layers 408 may respectively be configured to function as an etch stop layer during the single and/or dual damascene processes.

In some embodiments, the ILD layers 406 may, for example, be or comprise an oxide, such as silicon dioxide, a low-k dielectric material, an extreme low-k dielectric material, another dielectric material, or any combination of the foregoing. Thus, in some embodiments, the sidewall spacer 104 has a dielectric constant greater than the ILD layers 406. In further embodiments, the dielectric protection layers 408 may, for example, be or comprise silicon nitride, silicon carbide, silicon oxynitride, another suitable dielectric material, or the like. Therefore, in some embodiments, the sidewall spacer 104 has a dielectric constant less than the dielectric protection layers 408.

Figure 13:
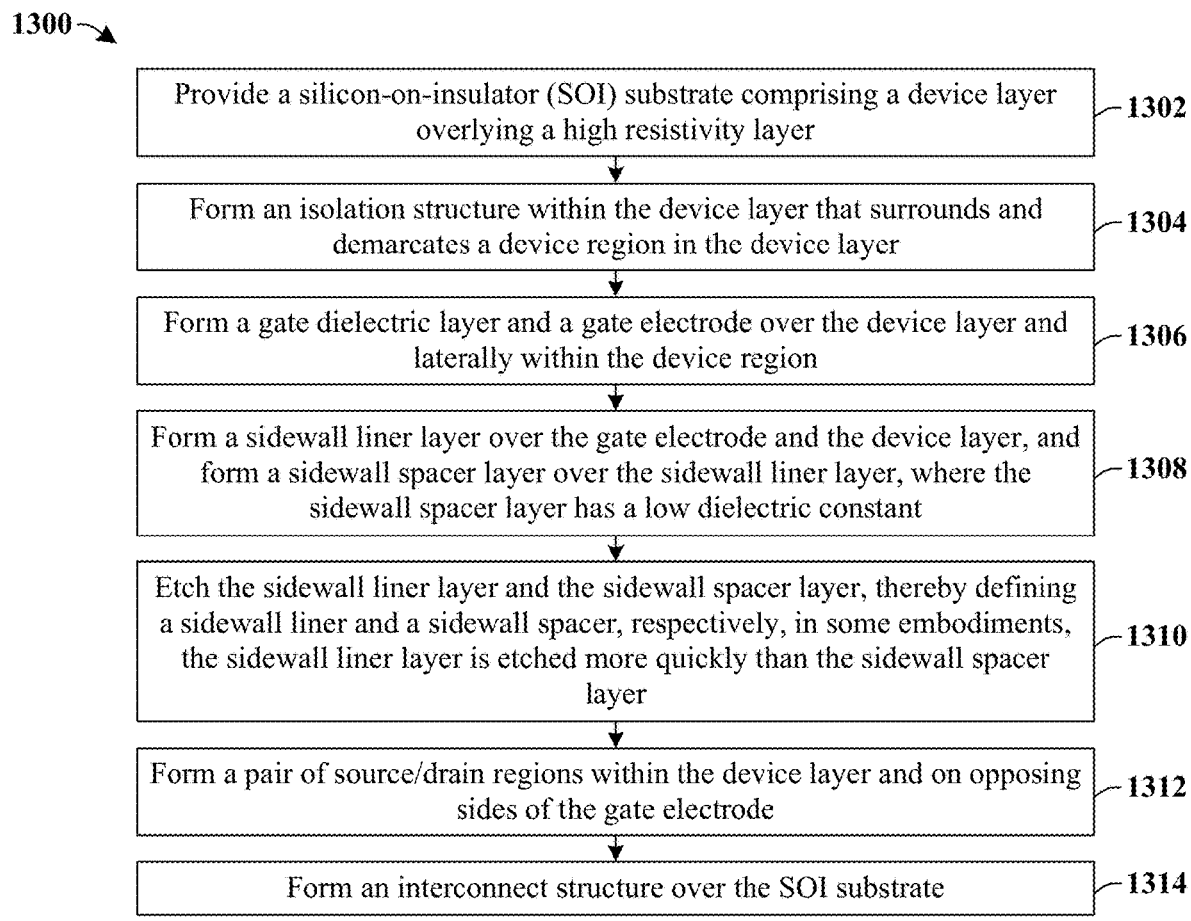
FIG. 13 illustrates a flow diagram of some embodiments corresponding to the method of FIGS. 5-12

FIG. 13 illustrates a flowchart of some embodiments of a method 1300 for forming an RF switch device with a sidewall spacer having a low dielectric constant according to the present disclosure. While the method 1300 of FIG. 13 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in or more separate acts and/or phases.

At act 1302, a silicon-on-insulator (SOI) substrate is provided. The SOI substrate comprises a device layer overlying a high resistivity layer. FIG. 5 illustrates a cross-sectional view 500 of some embodiments corresponding to act 1302.

At act 1304, an isolation structure is formed within the device layer. The isolation structure surrounds and demarcates a device region in the device layer. FIG. 6 illustrates a cross-sectional view 600 of some embodiments corresponding to act 1304.

At act 1306, a gate dielectric layer and a gate electrode are formed over the device layer and laterally within the device region. FIG. 7 illustrates a cross-sectional view 700 of some embodiments corresponding to act 1306.

At act 1308, a sidewall liner layer is formed over the gate electrode and the device layer, and a sidewall spacer layer is formed over the sidewall liner layer. The sidewall spacer layer has a low dielectric constant. FIG. 9 illustrates a cross-sectional view 900 of some embodiments corresponding to act 1308.

At act 1310, the sidewall liner layer and the sidewall spacer layer are etched, thereby defining a sidewall liner and a sidewall spacer, respectively. In some embodiments, the sidewall liner layer is etched more quickly than the sidewall spacer layer. FIG. 10 illustrates a cross-sectional view 1000 of some embodiments corresponding to act 1310.

At act 1312, a pair of source/drain regions are formed within the device layer and on opposing sides of the gate electrode. FIG. 11 illustrates a cross-sectional view 1100 of some embodiments corresponding to act 1312.

At act 1314, an interconnect structure is formed over the SOI substrate. FIG. 12 illustrates a cross-sectional view 1200 of some embodiments corresponding to act 1314.

Accordingly, in some embodiments, the present disclosure provides a radio frequency (RF) switch device disposed on/over a silicon-on-insulator (SOI) substrate, where the RF switch device comprises a gate dielectric layer, a gate electrode, source/drain regions, and a sidewall spacer. The sidewall spacer laterally surrounds sidewalls of the gate electrode and the gate dielectric layer, where the sidewall spacer has a dielectric constant less than that of silicon nitride.

In some embodiments, the present application provides a method for forming an integrated circuit (IC), the method including: forming a gate electrode and a gate dielectric stacked over a substrate; depositing a sidewall spacer layer covering the substrate and the gate electrode and further lining sidewalls of the gate electrode; etching back the sidewall spacer layer to form a sidewall spacer on the sidewalls of the gate electrode, wherein etching back is performed at an etch rate less than about 8 angstroms/minute using an etchant comprising hydrogen fluoride; and doping the substrate with the sidewall spacer and the gate electrode in place to form a pair of source/drain regions respectively on opposite sides of the gate electrode.

In some embodiments, the present application provides a method for forming an integrated circuit (IC), the method including: depositing a first pad layer covering a substrate;

depositing a second pad layer covering the first pad layer; patterning the first and second pad layer with a pattern for an isolation structure; performing an etch into the substrate with the first and second pad layers in place to form a trench that is in the substrate and that has the pattern, wherein the trench surrounds and demarcates a device region; filling the trench with a dielectric material; forming a gate electrode and a gate dielectric layer stacked on the device region; depositing a first dielectric layer covering the substrate and the gate electrode and further lining sidewalls of the gate electrode, wherein the first dielectric layer has a dielectric constant greater than that of the first pad layer and less than that of the second pad layer; etching back the first dielectric layer to form a sidewall spacer on the sidewalls of the gate electrode; and doping the substrate with the sidewall spacer and the gate electrode in place to form a pair of source/drain regions respectively on opposite sides of the gate electrode.

In some embodiments, the present application provides an integrated circuit (IC) including: a semiconductor-on-insulator (SOI) substrate including a device layer overlying an insulator layer and a high resistivity layer underlying the insulator layer; a pair of source/drain regions in the device layer; a gate dielectric layer on the device layer and laterally between the source/drain regions; a gate electrode overlying the gate dielectric layer; a sidewall liner disposed along sidewalls of the gate electrode and along an upper surface of the device layer; and a sidewall spacer overlying the device layer on sidewalls and an upper surface of the sidewall liner, wherein the sidewall spacer has a pair of segments respectively on opposite sides of the gate electrode, wherein the sidewall spacer has a dielectric constant less than about 7, and wherein the dielectric constant of the sidewall spacer is greater than that of the sidewall liner and greater than that of the insulator layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit (IC), the method comprising:
    forming a gate electrode and a gate dielectric stacked over a substrate;
    depositing a sidewall spacer layer covering the substrate and the gate electrode and further lining sidewalls of the gate electrode;
    etching back the sidewall spacer layer to form a sidewall spacer on the sidewalls of the gate electrode, wherein etching back is performed at an etch rate of about 5 angstroms/minute using an etchant comprising hydrogen fluoride; and
    doping the substrate with the sidewall spacer and the gate electrode in place to form a pair of source/drain regions respectively on opposite sides of the gate electrode.
2. The method according to claim 1, wherein the sidewall spacer layer consists essentially of silicon oxycarbonitride.

3. The method according to claim 1, wherein the etchant is a solution comprising about 1% hydrogen fluoride by weight.

4. The method according to claim 1, wherein the etching back is performed at an ambient temperature of about 630 degrees Celsius.

5. The method according to claim 1, wherein the sidewall spacer layer is deposited by an atomic layer deposition (ALD) process.

6. The method according to claim 5, wherein the ALD process comprises flowing hexachlorodisilane, propene, diatomic oxygen, and ammonia over the substrate and the gate electrode.

7. The method according to claim 5, wherein the ALD process comprises flowing hexachlorodisilane and diatomic oxygen over the substrate and the gate electrode, wherein the ALD process further includes performing a polishing process after flowing the hexachlorodisilane and before flowing the diatomic oxygen over the substrate and the gate electrode.

8. The method according to claim 1, further comprising:
    depositing a sidewall liner layer over the gate electrode and the substrate, wherein the sidewall liner layer is disposed between the sidewall spacer layer and the substrate, wherein a dielectric constant of the sidewall liner layer is less than a dielectric constant of the sidewall spacer layer.

9. The method according to claim 8, wherein the etching back removes portions of the sidewall liner layer to form a sidewall liner, wherein the sidewall liner layer is etched more quickly than the sidewall spacer layer during the etching back.

10. A method for forming an integrated circuit (IC), the method comprising:
    depositing a first pad layer covering a substrate;
    depositing a second pad layer covering the first pad layer;
    patterning the first and second pad layer with a pattern for an isolation structure;
    performing an etch into the substrate with the first and second pad layers in place to form a trench that is in the substrate and that has the pattern, wherein the trench surrounds and demarcates a device region;
    filling the trench with a dielectric material;
    forming a gate electrode and a gate dielectric layer stacked on the device region;
    depositing a first dielectric layer covering the substrate and the gate electrode and further lining sidewalls of the gate electrode, wherein the first dielectric layer has a dielectric constant greater than that of the first pad layer and less than that of the second pad layer, wherein the first dielectric layer consists essentially of silicon oxycarbonitride;
    etching back the first dielectric layer to form a sidewall spacer on the sidewalls of the gate electrode; and
    doping the substrate with the sidewall spacer and the gate electrode in place to form a pair of source/drain regions respectively on opposite sides of the gate electrode.

11. The method according to claim 10, further comprising:
    removing the second pad layer before the forming of the gate electrode.

12. The method according to claim 10, wherein the first and second pad layers respectively comprise silicon oxide and silicon nitride.

13. The method according to claim 10, wherein etching back comprises applying an aqueous solution to the first dielectric layer, and wherein the aqueous solution comprises hydrogen fluoride.

14. The method according to claim 13, wherein the substrate comprises:
a first silicon layer;
a polysilicon layer overlying the first silicon layer;
an insulator layer overlying the polysilicon layer; and
a second silicon layer overlying the insulator layer.

15. The method according to claim 10, wherein silicon is about 30-35 atomic percent of the sidewall spacer, carbon is about 3-10 atomic percent of the sidewall spacer, nitrogen is about 16-20 atomic percent of the sidewall spacer, and oxygen is about 40-45 atomic percent of the sidewall spacer.

16. The method according to claim 10, wherein the first dielectric layer is etched at a rate of about 5 angstroms per minute during the etching back.

17. A method for forming an integrated circuit (IC), the method comprising:
forming a gate electrode and a gate dielectric stacked over a substrate;
depositing a sidewall liner layer over the substrate and a sidewall spacer layer over the sidewall liner layer, wherein the sidewall liner layer and the sidewall spacer layer line sidewalls of the gate electrode, wherein depositing the sidewall spacer layer includes flowing hexachlorodisilane and diatomic oxygen over the substrate, wherein a first etch process is performed after flowing the hexachlorodisilane and before flowing the diatomic oxygen;
performing a second etch process on the sidewall liner layer and the sidewall spacer layer to form a sidewall liner and a sidewall spacer, respectively, wherein the sidewall spacer comprises silicon oxycarbonitride, wherein silicon is about 30 to 35 atomic percent of the sidewall spacer, carbon is about 3 to 10 atomic percent of the sidewall spacer, nitrogen is about 16 to 20 atomic percent of the sidewall spacer, and oxygen is about 40 to 45 atomic percent of the sidewall spacer; and
forming a pair of source/drain regions within the substrate on opposing sides of the gate electrode.

18. The method according to claim 17, wherein a dielectric constant of the sidewall liner is less than a dielectric constant of the sidewall spacer, and wherein a dielectric constant of the gate dielectric is greater than the dielectric constant of the sidewall spacer.

19. The method according to claim 17, wherein during the second etch process the sidewall spacer layer is etched at a first rate of about 5 angstroms per minute.

20. The method according to claim 17, wherein the first and second etch processes respectively use an etchant comprising hydrogen fluoride.

* * * * *